United States Patent
Kirihara et al.

(10) Patent No.: US 7,303,626 B2
(45) Date of Patent: Dec. 4, 2007

(54) THREE-DIMENSIONAL PERIODIC STRUCTURE AND METHOD FOR PRODUCING THE SAME

(75) Inventors: Soshu Kirihara, Mino (JP); Yoshinari Miyamoto, Ikeda (JP); Takuji Nakagawa, Muko (JP); Katsuhiko Tanaka, Ibaragi (JP)

(73) Assignee: Murata Manufacturing Co., Ltd. (JP)

( * ) Notice: Subject to any disclaimer, the term of this patent is extended or adjusted under 35 U.S.C. 154(b) by 289 days.

(21) Appl. No.: 10/535,105

(22) PCT Filed: Apr. 20, 2004

(86) PCT No.: PCT/JP2004/005592

§ 371 (c)(1),
(2), (4) Date: May 16, 2005

(87) PCT Pub. No.: WO2004/109344

PCT Pub. Date: Dec. 16, 2004

(65) Prior Publication Data

US 2006/0011126 A1    Jan. 19, 2006

(30) Foreign Application Priority Data

Jun. 5, 2003    (JP) .............................. 2003-161219

(51) Int. Cl.
*C30B 29/54* (2006.01)

(52) U.S. Cl. .................... 117/4; 117/5; 117/6; 117/928
(58) Field of Classification Search ................ 117/2, 117/3, 4, 5, 6, 926
See application file for complete search history.

(56) References Cited

U.S. PATENT DOCUMENTS

| 6,517,763 | B1 * | 2/2003 | Zakhidov et al. | ........... 264/344 |
| 2002/0041425 | A1 * | 4/2002 | Baba et al. | ................. 359/322 |
| 2003/0214690 | A1 * | 11/2003 | Escuti et al. | .................. 359/15 |

FOREIGN PATENT DOCUMENTS

| JP | 2000-341031 | 12/2000 |
| JP | 2001-042144 | 2/2001 |
| JP | 2001-502256 | 2/2001 |
| JP | 2001-074954 | 3/2001 |
| JP | 2001-074955 | 3/2001 |
| JP | 2001-261977 | 9/2001 |
| JP | 2001-518707 | 10/2001 |
| JP | 2002-071981 | 3/2002 |

OTHER PUBLICATIONS

Japanese Office Action issued Jun. 12, 2007 to support cited references previously filed on May 16, 2005.

* cited by examiner

*Primary Examiner*—Robert Kunemund
(74) *Attorney, Agent, or Firm*—Dickstein, Shapiro, LLP.

(57) ABSTRACT

Photonic crystal units (10a, 10b, and 10c) are formed by an optical molding process using a photocurable resin, and partitions (11) are provided at the boundaries therebetween. The voids in each photonic crystal unit are filled with a second substance containing ceramic particles dispersed therein to form a filled portion 2. A plurality of three-dimensional periodic structure units containing the first and second substances distributed with three-dimensional periodicity are arranged so as to have different ratios between the dielectric constants of the first and second substances. Therefore, present invention provides a three-dimensional periodic structure having a wide photonic band gap which could not be obtained in a conventional three-dimensional periodic structure.

20 Claims, 8 Drawing Sheets

THREE-DIMENSIONAL PERIODIC STRUCTURE AND METHOD FOR PRODUCING THE SAME

TECHNICAL FIELD

The present invention relates to a three-dimensional periodic structure and a method for producing the same.

BACKGROUND ART

In a solid crystal, a periodic potential distribution of atomic nuclei exhibits interference with an electron wave at a wavelength corresponding to the lattice constant. Namely, when the wavelength of an electron wave is close to the potential period of a crystal, reflection occurs due to three-dimensional diffraction (Bragg diffraction). This phenomenon forbids the passage of electrons contained in a specified energy region. This forms an electronic band gap used for semiconductor devices and the like.

Similarly, a three-dimensional structure periodically changing in refractive index or dielectric constant exhibits interference with electromagnetic waves and cuts off electromagnetic waves in a specified frequency region. In this case, a forbidden band is referred to as a "photonic band gap", and the three-dimensional structure is referred to as a "photonic crystal".

By using the above-described action, the photonic crystal is possibly used as a cut-off filter for cutting off transmission of electromagnetic waves in a predetermined frequency region, or as a waveguide or a resonator in which a heterogeneous portion, which disturbs periodicity, is introduced into the periodic structure, for trapping light or an electromagnetic wave in the portion. Also, the photonic crystal is possibly applied to an ultralow-threshold laser for light, a high-directivity antenna for electromagnetic waves, or the like.

Figure 6:
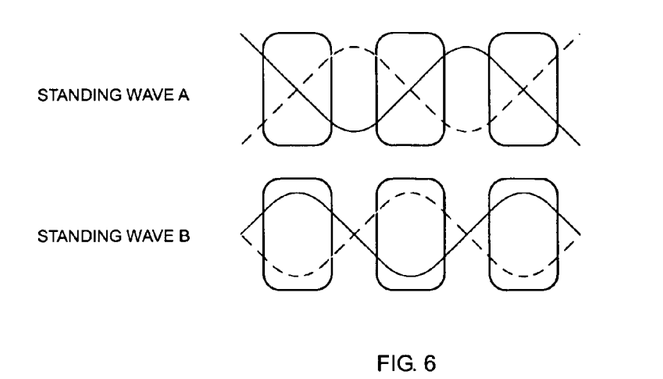
FIG. 6 is a drawing showing two standing waves generated when two substances having different dielectric constants are periodically distributed.

When Bragg diffraction of an electromagnetic wave occurs in the photonic crystal, two types of standing waves are generally formed. FIG. 6 shows the two types of standing waves. The standing wave shown in FIG. 6A has high vibration energy in a region with a low dielectric constant, and the standing wave shown in FIG. 6B has high vibration energy in a region with a high dielectric constant. A wave at an energy level between the two standing waves split into two different modes is not allowed to be present in the crystal, thereby causing a band gap.

The photonic crystal has a one-, two-, or three-dimensional structure, but a three-dimension structure is required for obtaining a complete photonic band gap.

Examples of a method for forming a three-dimensional structure include a method using a square timber stacked film (Patent Documents 1 and 2) or a shape-preserving multilayer film utilizing auto-cloning (Patent Document 3), a method using optical molding (Patent Documents 4 and 5), and a method of arranging particles (Patent Document 6). These documents disclose a technique for forming a photonic crystal by processing an insulator, a dielectric material, or a semiconductor material such as an organic material, ceramic, Si, or the like. Also, a three-dimensional structure formed by curing a mixture containing a resin composition and dielectric particles is disclosed (Patent Document 7).

[Patent Document 1] PCT Japanese Translation Patent Publication No. 2001-518707

[Patent Document 2] Japanese Unexamined Patent Application Publication No. 2001-74955

[Patent Document 3] Japanese Unexamined Patent Application Publication No. 2001-74954

[Patent Document 4] Japanese Unexamined Patent Application Publication No. 2000-341031

[Patent Document 5] PCT Japanese Translation Patent Publication No. 2001-502256

[Patent Document 6] Japanese Unexamined Patent Application Publication No. 2001-42144

[Patent Document 7] Japanese Unexamined Patent Application Publication No. 2001-261977

It is known that a photonic band gap obtained in such a photonic crystal widens as the contrast between the dielectric constants or refractive indexes of two constituent materials increases.

However, the limits of dielectric constants and refractive indexes of the above-described practical materials are about 15 and 3.0, respectively, for example, in a frequency band of 10 to 30 GHz. It is thus difficult to further increase the difference (or ratio) between the dielectric constants or refractive indexes of air and these materials. Therefore, a wide photonic band gap cannot be obtained using a three-dimensional periodic structure composed of a dielectric material having a constant dielectric constant.

A conceivable method for resolving this problem is to widen a band gap by combining periodic structures having various band gaps. Namely, as disclosed in Patent Document 4, an effective method comprises forming a structure by optically molding a photocurable resin containing a ceramic dielectric material dispersed therein or arranging solids each containing a ceramic dielectric material dispersed therein to form a crystal in which the lattice constant continuously changes or the dielectric constant changes. However, some ceramic materials to be dispersed inhibit curing of the photocurable resin and transmittance, thereby causing difficulty in optical molding. Therefore, usable materials are limited, and thus the amount of the ceramic dielectric material dispersed is also limited.

In order to resolve this problem, the method disclosed in Patent Document 7 is also effective, in which a mixture containing a resin composition and dielectric particles is cured. However, a dielectric material is compounded and thus liable to decrease in dielectric constant. The method comprising arranging thermosetting resin or thermoplastic resin blocks containing a ceramic dielectric material dispersed therein to form a structure has difficulty in forming a complicated structure such as a diamond structure.

On the other hand, Patent Document 5 discloses the method in which a resin structure formed by optical molding is impregnated with a resin containing high-dielectric-constant ceramic dispersed therein to form a photonic crystal. However, a wide photonic band gap cannot be formed based on only the contents disclosed in Patent Document 5.

Accordingly, an object of the present invention is to provide a three-dimensional periodic structure having a wide photonic band gap, which could not be obtained in a conventional structure, and a method for producing the structure.

DISCLOSURE OF INVENTION

A three-dimensional periodic structure of the present invention comprises a plurality of three-dimensional periodic structure areas each containing first and second substances having different dielectric constants, the first and second substances being periodically distributed in a three-dimensional space, wherein the plurality of three-dimensional periodic structure areas have different ratios between the dielectric constants of the first substance and the second substrate.

As described above, when the plurality of three-dimensional periodic structure areas having different ratios between the dielectric constants of the first substance and the second substance is disposed, a photonic band gap over a wide frequency band can be formed by combining the characteristics of the photonic band gaps of the respective three-dimensional periodic structure areas.

A three-dimensional periodic structure of the present invention comprises a plurality of three-dimensional periodic structure areas each containing first and second substances having different dielectric constants, the first and second substances being periodically distributed in a three-dimensional space, wherein the plurality of three-dimensional periodic structure areas have different average dielectric constants.

In this structure, a photonic band gap over a wide frequency band can be obtained by combining the photonic band gaps appearing in different frequency bands according to the average dielectric constants.

In the present invention, the first substance is a resin cured by optical activation, the resin constituting a crystal portion having voids distributed with a three-dimensional period, and the second substance is a resin containing ceramic particles dispersed therein, the voids being filled with the second substance.

In this structure, a three-dimensional periodic structure composed of the first substance can be precisely and easily formed, and a three-dimensional periodic structure composed of the second substance having a high dielectric constant can easily be formed.

In the present invention, the first substance is a resin cured by optical activation and containing ceramic particles dispersed therein, the resin constituting a crystal portion having voids distributed with three-dimensional periodicity, and the second substance is a resin filling in the voids.

In this structure, a three-dimensional periodic structure comprising the first and second substances having different dielectric constants can be precisely and easily formed.

In the present invention, the second substance is a thermosetting resin or thermoplastic resin and is thermally cured after being charged in the voids. Therefore, a three-dimensional periodic structure entirely in a solid state can be formed.

A three-dimensional periodic structure of the present invention comprises a plurality of three-dimensional periodic structure units which are arranged so that the ratio between dielectric constants is changed to increase or decrease in a direction in the arrangement.

In this structure, a photonic band gap over a wider range can be obtained by effectively combining the photonic band gaps of the adjacent three-dimensional periodic structure units having different ratios between the dielectric constants of first and second substances.

In the present invention, one period is 0.1 mm to 30 mm. Therefore, the present invention can provide a three-dimensional periodic structure having a wide photonic band gap, for example, in a frequency band of 10 GHz to 30 GHz.

A method for producing a three-dimensional periodic structure of the present invention comprises the step of forming a three-dimensional periodic structure using a first substance by an optical molding process in which light irradiation of a photocurable resin is repeated for every sectional pattern layer to be formed, and then providing partitions for dividing the three-dimensional periodic structure into a plurality of areas; the step of filling, by vacuum degassing, voids of the respective areas of the structure composed of the first substance with a plurality of second substances having different contents of ceramic particles dispersed in a resin; and the step of curing the second substances.

In this method, the structure composed of the first substance is divided into the plurality of areas by the partitions, and the respective areas are filled with the plurality of second substances having different contents of the ceramic particles. It is thus possible to easily arrange a plurality of three-dimensional periodic structure areas having different ratios between the dielectric constants of the first and second substances.

BEST MODE FOR CARRYING OUT THE INVENTION

A three-dimensional periodic structure and a method for producing the same according to a first embodiment of the present invention will be described with reference to the drawings.

Figure 2A:
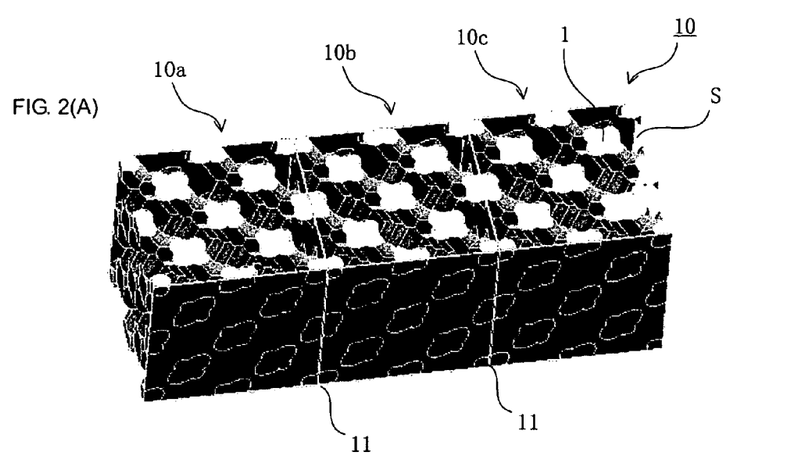
FIG. 2 is a drawing showing steps for producing the three-dimensional periodic structure.

FIG. 2(A) to 2(D) show steps for producing a three-dimensional periodic structure. FIG. 2(A) is a perspective view of a photonic crystal 10. The photonic crystal 10 has a structure in which three photonic crystal units 10a, 10b, and 10c are connected together. Each of the photonic crystal units comprises a photonic crystal portion 1 and voids S. The photonic crystal portion 1 is formed by optical molding using an epoxy photocurable resin as a first substance having a dielectric constant of 2.2, as described below. The photonic crystal 10 further comprises partitions 11 provided at the respective boundaries between the adjacent photonic crystal units so as to avoid communication between the voids of the S adjacent photonic crystal units.

Each of the photonic crystal units 10a, 10b, and 10c has a three-dimensional periodic structure in which diamond crystal lattices with a lattice constant of 12 mm are arranged in two lines each in the lengthwise, widthwise, and heightwise directions.

Figure 2B:
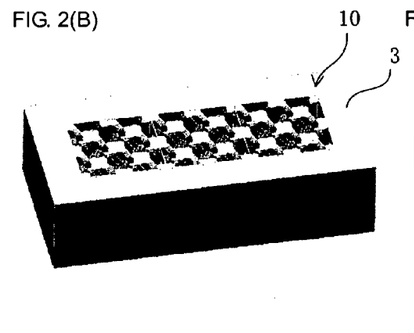

FIG. 2(B) shows a state in which the photonic crystal units 10 are placed in an impregnation mold 3 made of polytetrafluoroethylene.

Figure 2C:
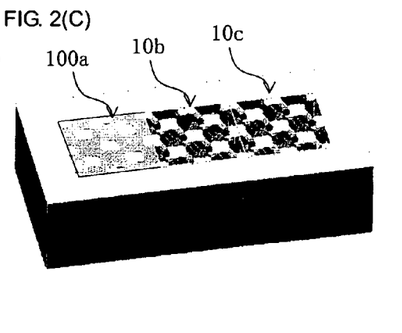
Figure 3A:
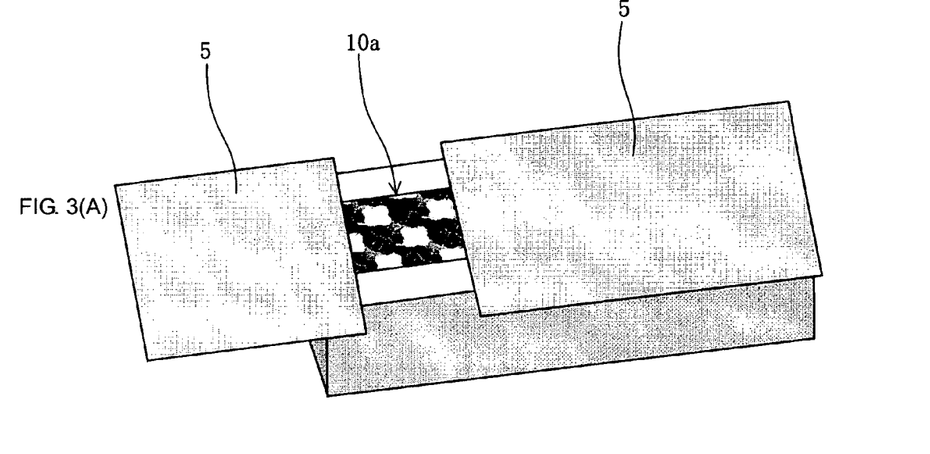
FIG. 3 is a drawing showing impregnation steps for filling second substances.
Figure 3B:
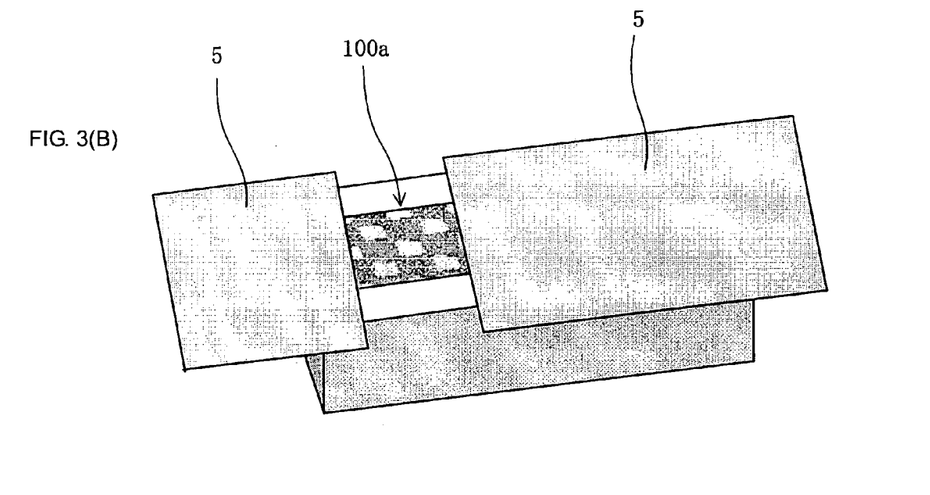

Then, as shown in FIG. 3(A) and 3(B) an unnecessary portion of the units is covered with a cover 5, and a desired photonic crystal unit is impregnated with a second substance. Namely, the voids of the desired photonic crystal unit are filled with the second substance. In the example shown in FIG. 3(A), the cover 5 is mounted so that the photonic crystal unit 10a is exposed, and the photonic crystal unit 10a is impregnated with the second substance to form a three-dimensional periodic structure unit 100a, as shown in FIG. 2(C).

Similarly, the photonic crystal units 10b and 10c are respectively impregnated with second substances. However, the second substances used for the respective photonic crystal units 10a, 10b, and 10c have different relative dielectric constants.

As the second substances, a polyester resin containing calcium titanate dispersed therein is used. Specifically, "Eporak G-110AL" produced by Nippon Shokubai Co., Ltd. is used as the polyester resin, and "Permeck N" produced by NOF Corporation is used as a curing agent. Both materials are mixed to prepare a curable polyester resin having a relative dielectric constant of 3. The curable polyester resin is mixed with calcium titanate at a predetermined ratio to the curing polyester resin, the calcium titanate having an average particle diameter of 1.5 µm and a relative dielectric constant of 180, followed by stirring and vacuum degassing. As a result, one of the second substances in an uncured state is obtained. In this embodiment, the three contents of calcium titanate, i.e., 30 vol %, 25 vol %, and 20 vol %, are used.

The photonic crystal units 10a, 10b, and 10c placed in the impregnation mold 3 shown in FIG. 2(B) are impregnated in turn with the respective second substances in an uncured state having the different contents of calcium titanate, and then the impregnation mold is entirely placed in a vacuum container and evacuated with a vacuum pump to degas under vacuum.

Figure 2D:
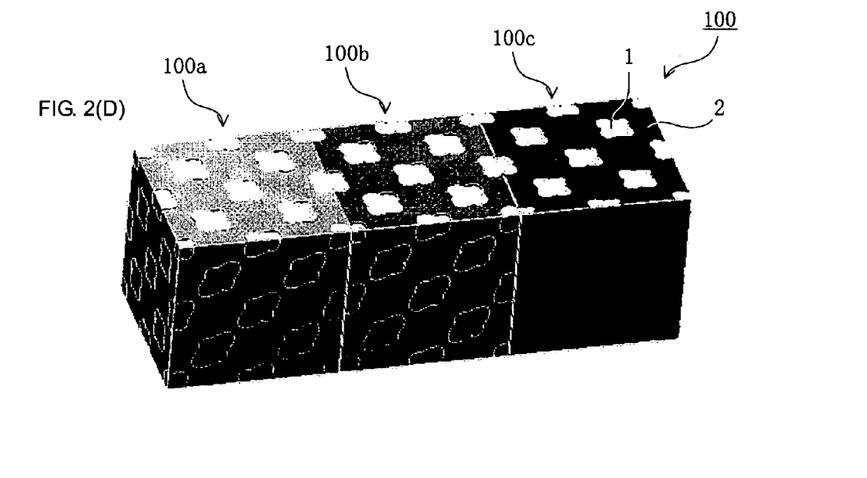

Then, the second substances are cured to form the three-dimensional periodic structure 100 shown in FIG. 2(D). In FIG. 2(D), reference numeral 2 denotes a void filled with one of the second substances in the photonic crystal portion 1.

Figure 4A:
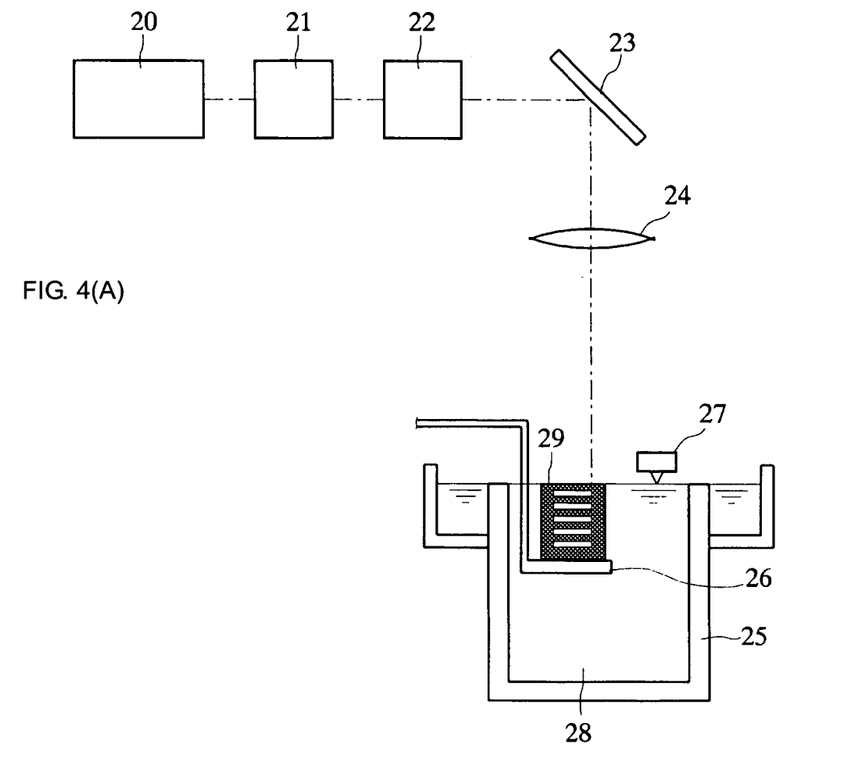
FIG. 4 is a drawing showing the configuration of an optical molding apparatus.

FIG. 4(A) shows an apparatus for producing the photonic crystal 10 shown in FIG. 2(A). In this figure, a vessel 25 is filled with an epoxy photocurable resin 28 which is cured by ultraviolet rays. Also, an elevator table 26 is provided in the vessel 25 so as to be vertically moved. An object 29 is molded on the elevator table 26. Furthermore, a squeegee 27 is provided near the surface of the photocurable resin 28, for coating the photocurable resin 28 to a predetermined thickness on the top of the object 29.

An optical system includes a laser diode 20, a harmonic generator (LBO) 21 generating ultraviolet light by wavelength conversion of a laser beam emitted from the laser diode 20, an acoustooptical device (AOM) 22 serving as a wavelength selecting device, a scanning mirror 23, and an fθ lens 24.

Figure 4B:
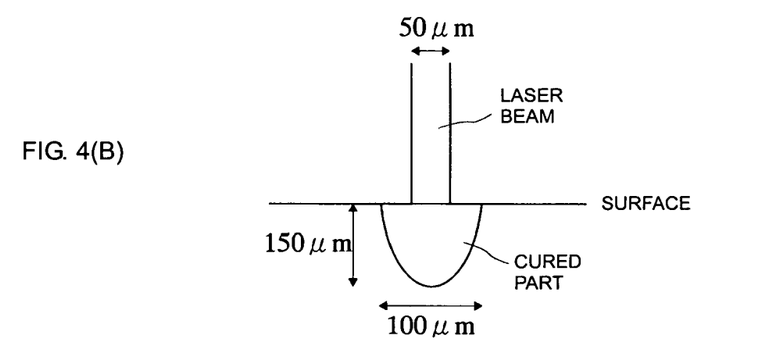

A photonic crystal is produced using the optical molding apparatus according to the following procedures:

First, the elevator table 26 is moved downward from the surface of the photocurable resin 28 to a predetermined depth, and the squeegee 27 is moved along the surface to form a photocurable resin film having a thickness of about 100 µm on the surface of the elevator table 26. In this state, as shown in FIG. 4(B), the surface LS is irradiated, by the optical system, with an ultraviolet laser beam LB at a wavelength of 355 nm with a spot diameter of 50 µm and an output of 110 mW. The irradiation is controlled by modulating the laser diode 20 while controlling the scanning mirror 23 so that the laser beam is applied to a desired curing position of the photocurable resin 28, but not applied to other regions.

In this irradiation, a spherical cured phase PR having a diameter of about 100 µm is formed by a polymerization reaction in the surface of the photocurable resin 28 irradiated with the laser beam. When the laser beam is scanned at a speed of 90 m/s, the cured phase having a thickness of about 150 µm is formed.

Consequently, the object 29 corresponding to a first sectional pattern layer is formed by raster scanning of the laser beam.

Next, the elevator table 26 is moved downward to a depth of about 200 µm from the surface, and the squeegee 27 is moved to form a photocurable resin film having a thickness of about 200 µm on the surface of the object 29.

Then, the laser beam is scanned and modulated by the same method as that for forming the first layer to form a second sectional pattern layer on the first layer. At the same time, both layers are bonded together by polymerization curing. Similarly, a third layer and upper layers are formed. This process is repeated to mold the object 29.

Figures 5A, 5B, 5C:
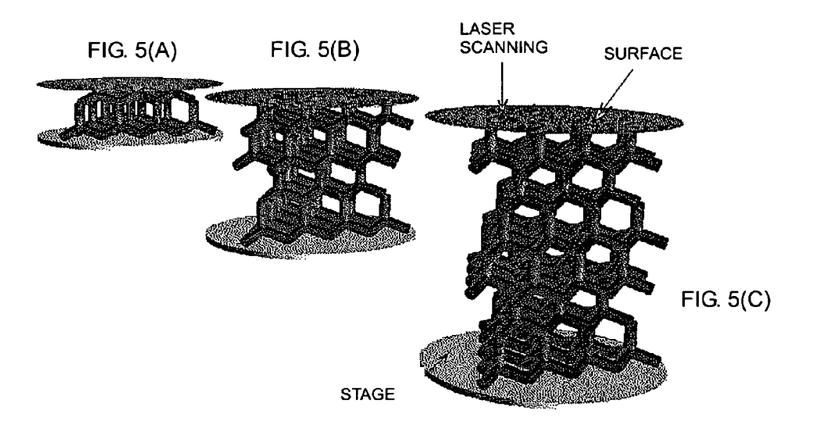
FIG. 5 is a drawing showing states in the course of object molding by the optical molding apparatus.

FIGS. 5(A) to 5(C) are is a perspective views showing the shape of the object in each step for forming a plurality of layers. FIG. 5(A) shows a state in which about one unit is formed in the crystal axis <111> direction of a diamond structure. FIG. 5(B) shows a state in which about four units are formed, and FIG. 5(C) shows a state in which a predetermined number of units are formed by repeating the above process.

In order to cure the photocurable resin 28 through a predetermined sectional pattern at the surface using the apparatus shown in FIG. 4(A), a CAD/CAM process is used. Namely, the pattern shown in FIG. 5(C) is previously designed by CAD handling three-dimensional data, and the three-dimensional structure data thereof is converted to STL (Standard Triangulation Language) data which is then converted to a set of two-dimensional sectional data at predetermined positions using a slice software. Finally, on the basis of the two-dimensional sectional data, data for modulating the laser diode in raster-scanning of the laser beam is formed. On the basis of the data prepared as described above, the laser beam is scanned, and the laser diode is modulated.

Then, the object 29 formed using the photocurable resin according to the above-described procedures is removed from the vessel 25, washed for removing the uncured photocurable resin, dried, and then cut into a predetermined size to form the photonic crystal unit 10 shown in FIG. 2(A).

Figure 1:
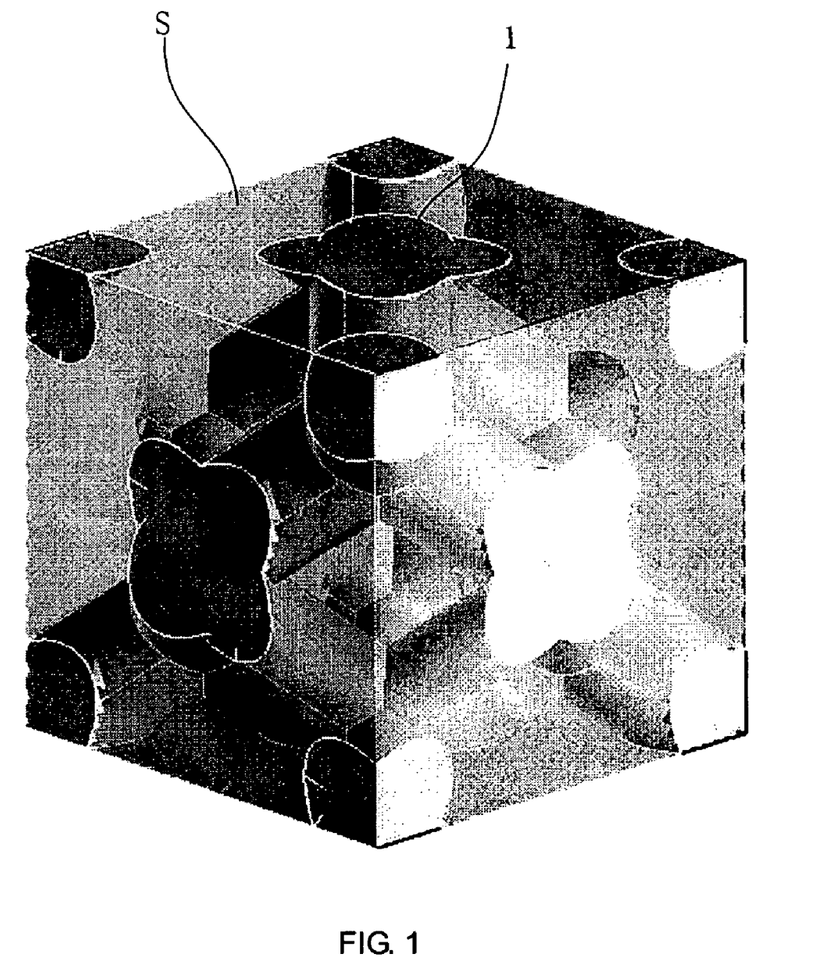
FIG. 1 is a perspective view showing the unit structure of a three-dimensional periodic structure according to a first embodiment of the present invention.

FIG. 1 shows the unit lattice of a diamond crystal. In this figure, reference numeral 1 denotes a photonic crystal portion, and reference symbol S denotes a void. The unit lattice of the diamond structure contains eight lattice points, and each half of the eight lattice points forms an individual face-centered cubic lattice. One of the lattices holds a position apart from the other lattice by a length of ¼ of the body diagonal in parallel with the body diagonal.

As described above, each of the photonic crystal units 10a, 10b, and 10c includes the diamond crystal lattices having a lattice constant of 12 mm, the diamond crystal lattices being arranged in two lines each in the lengthwise, widthwise, and heightwise directions. The partitions 11 at the boundaries between the adjacent photonic crystal units are formed by the optical molding process at the same time as the photonic crystal units 10a, 10b, and 10c. Alternatively, the photonic crystal units 10a, 10b, and 10c may be formed separately, and then bonded together with sheets serving as the partitions 11 provided between the adjacent units.

Figure 7:
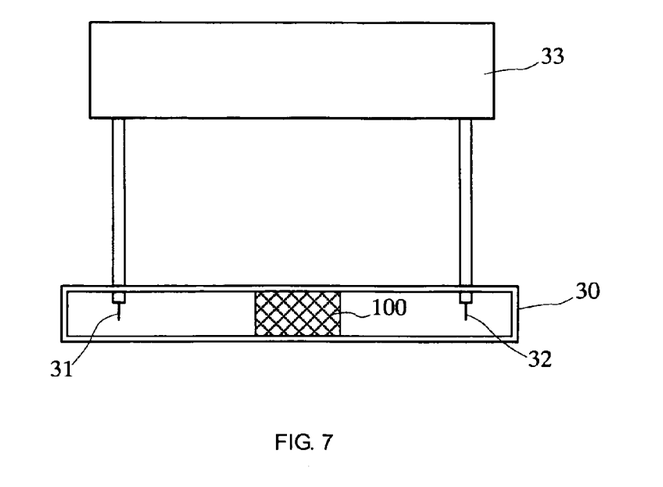
FIG. 7 is a drawing showing the configuration of an apparatus for measuring the electromagnetic characteristics of a three-dimensional periodic structure.

FIG. 7 shows an apparatus for measuring the characteristics of the three-dimensional periodic structure 100. The measuring apparatus comprises a M-band waveguide 30, and probes 31 and 32 inserted into the waveguide 30. The three-dimensional periodic structure 100 is inserted as a sample into the waveguide 30. Also, a network analyzer 33 is connected to the probes 31 and 32. The propagation characteristics of an electromagnetic wave are measured with the network analyzer 33. In FIG. 7, the three-dimensional periodic structure 100 is disposed so that the connection direction (longitudinal direction) of the three three-dimensional periodic structure units coincides with the propagation direction of the electromagnetic wave through the waveguide 30. The waveguide 30 has internal dimensions of 20 mm in width and 10 mm in length, and the three-dimensional periodic structure 100 has dimensions of 20 mm in the length direction and 10 mm in the height direction of the waveguide 30.

Figure 8A:
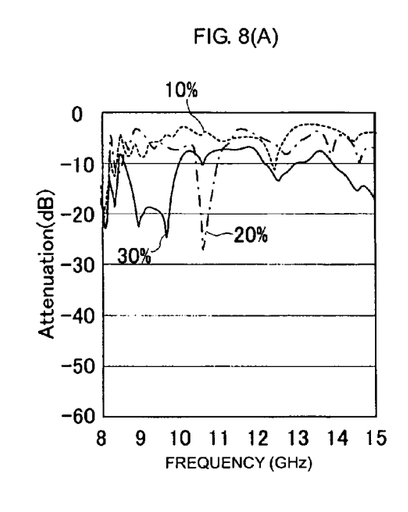
FIG. 8 is a graph showing the measurement results of electromagnetic characteristics.
Figure 8B:
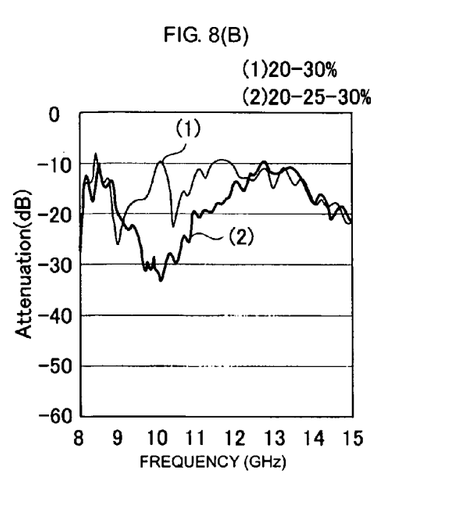

FIGS. 8(A) and 8(B) show the electromagnetic wave propagation characteristics of the three-dimensional periodic structure. FIG. 8(A) shows the propagation characteristics measured using each of the second substances having contents of 10%, 20%, and 30%, respectively, of calcium titanate dispersed therein for comparison. FIG. 8(B) shows the propagation characteristics of a three-dimensional periodic structure (1) in which two three-dimensional periodic structure units having contents of 20% and 30%, respectively, of calcium titanate dispersed therein were combined. FIG. 8(B) also shows the propagation characteristics of a three-dimensional periodic structure (2) in which three three-dimensional periodic structure units having contents of 20%, 30%, and 40%, respectively, of calcium titanate dispersed therein were combined, as shown in FIG.2(D).

In each of the three-dimensional periodic structure units 100a, 100b, and 100c shown in FIG. 2(D), the relative dielectric constants of the photonic crystal portion 1 (first substance) and the filled portion 2 (second substance) are as shown in Table 1.

TABLE 1

| Three-dimensional periodic structure unit | | 100a | 100b | 100c | | |
|---|---|---|---|---|---|---|
| Calcium titanate (vol %) | 10 | 20 | 25 | 30 | 40 |
| Relative dielectric constant | 4.2 | 6.1 | 8.0 | 9.8 | 12.0 |
| Dielectric constant ratio | 1.9 | 2.8 | 3.6 | 4.5 | 5.5 |
| Rate of change in dielectric constant ratio (times) | | └ 1.28 ┘└ 1.25 ┘└ 1.22 ┘ └ 1.6 ┘ | | | | |

A content of 40% of dispersed calcium titanate shown in Table 1 will be referred to as an example below.

FIG. 8(A) indicates that when the ratio between the dielectric constants of the first and second substances is constant, a wide photonic band gap cannot be obtained. FIG. 8(B) indicates that when the adjacent three-dimensional periodic structure units have a high rate of change in the ratio between the dielectric constants of the first and second substances, a wide band gap cannot be obtained, as shown by the structure (1). However, as shown by the structure (2) in FIG. 8(B), when the ratio between the dielectric constants of the first and second substances is changed so that adjacent three-dimensional periodic structure units have different ratios between the dielectric constants of the first and second substances, a band gap over a wide frequency band can be achieved. In particular, as in the three-dimensional periodic structure of this embodiment, when the ratio between the dielectric constants is changed to increase or decrease in a direction along the arrangement direction of the three-dimensional periodic structure units, a sufficient attenuation can be obtained in a wide frequency band.

Figure 9:
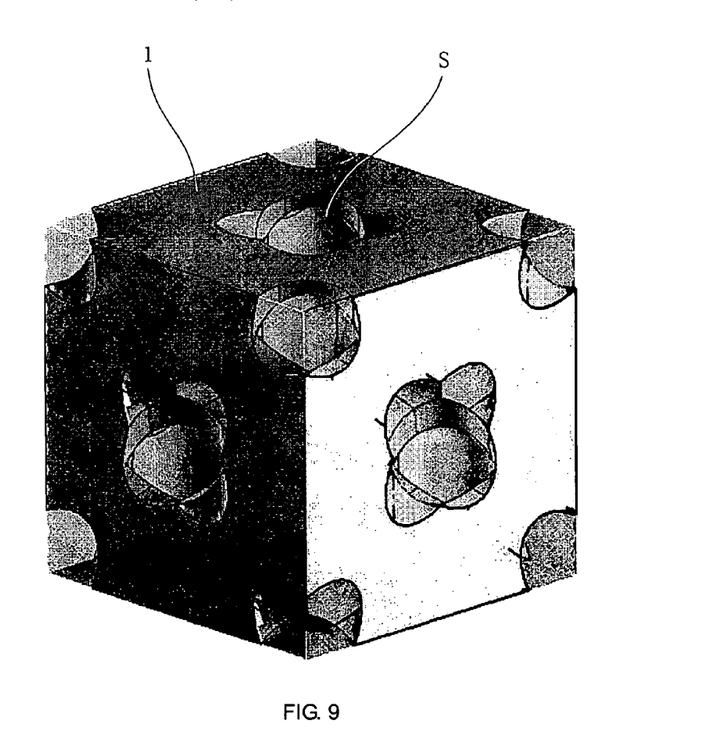
FIG. 9 is a perspective view showing the unit structure of a three-dimensional periodic structure according to a second embodiment of the present invention.

Next, a three-dimensional periodic structure according to a second embodiment of the present invention will be described with reference to FIGS. 9 and 10.

Unlike in the three-dimensional periodic structure according to the first embodiment, in the three-dimensional periodic structure of this embodiment, voids hold positions corresponding to a diamond crystal lattice. FIG. 9 shows the crystal unit lattice. In FIG. 9, reference numeral 1 denotes a photonic crystal portion composed of a first substance, and reference symbol S denotes a void. In the second embodiment, three three-dimensional periodic structure units having contents of 20%, 30%, and 40%, respectively, of calcium titanate dispersed therein are connected. The other structural portions and the production method are the same as in the first embodiment.

Figure 10A:
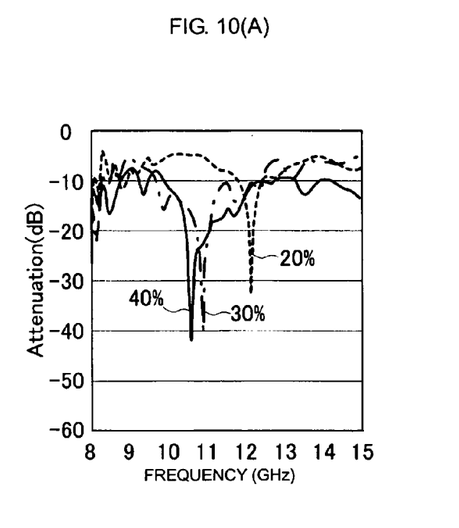
FIG. 10 is a graph showing the measurement results of electromagnetic characteristics of the three-dimensional periodic structure.
Figure 10B:
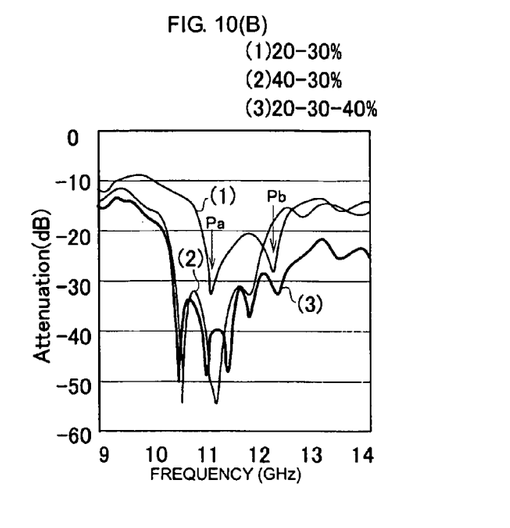

FIGS. 10(A) and 10(B) show the electromagnetic wave propagation characteristics of the three-dimensional periodic structure. In this figure, FIG. 10(A) shows the propagation characteristics measured using each of the second substances having contents of 20%, 30%, and 40%, respectively, of calcium titanate dispersed therein. FIG. 10(B) shows the propagation characteristics of a three-dimensional periodic structure (1) in which two three-dimensional periodic structure units having contents of 20% and 30%, respectively, of calcium titanate dispersed therein were combined. FIG. 10(B) also shows the propagation characteristics of a three-dimensional periodic structure (2) in which two three-dimensional periodic structure units having contents of 40% and 30%, respectively, of calcium titanate dispersed therein were combined. FIG. 10(B) further shows the propagation characteristics of a three-dimensional periodic structure (3) in which three three-dimensional periodic structure units having contents of 20%, 30%, and 40%, respectively, of calcium titanate dispersed therein were combined.

As described above, when the ratio between the dielectric constants of the first and second substances is changed so that the adjacent three-dimensional periodic structure units have different ratios between the dielectric constants of the first and second substances, the band gap can be widened.

A three-dimensional periodic structure according to a third embodiment of the present invention will be described with reference to FIGS. 11 and 12.

Figure 11:
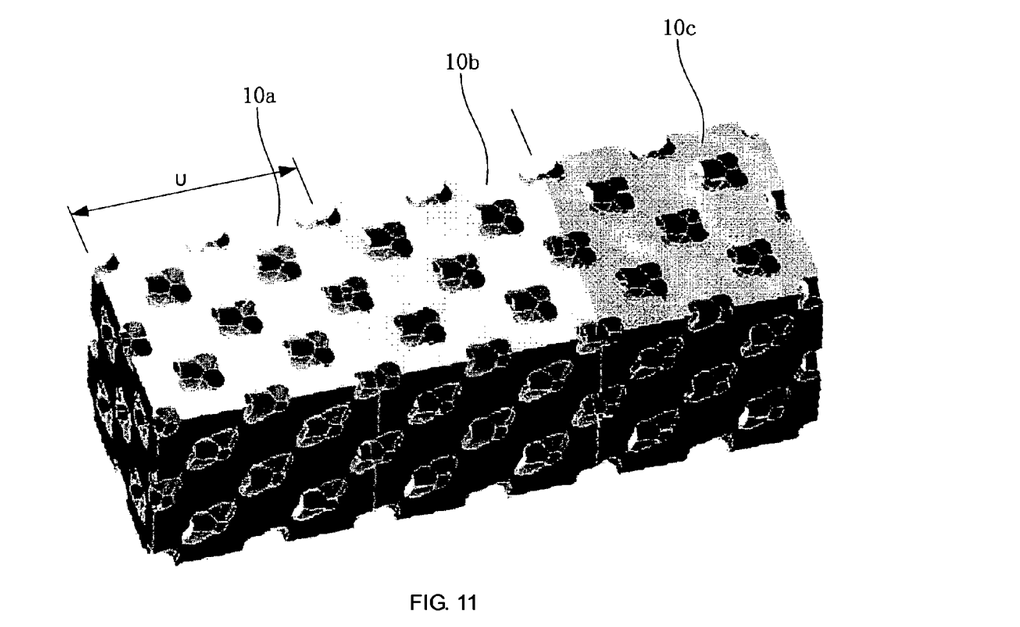
FIG. 11 is a perspective view showing the unit structure of a three-dimensional periodic structure according to a third embodiment of the present invention.

FIG. 11 shows a three-linked three-dimensional periodic structure. In this embodiment, as a first substance constituting each of photonic crystal units 10a, 10b, and 10c, an epoxy optical molding resin having a relative dielectric constant of 2.8 and containing calcium titanate dispersed therein is used. Furthermore, the photonic crystal units 10a, 10b, and 10c have different contents of calcium titanate. In FIG. 11, reference character U denotes the range of each unit.

Figure 12:
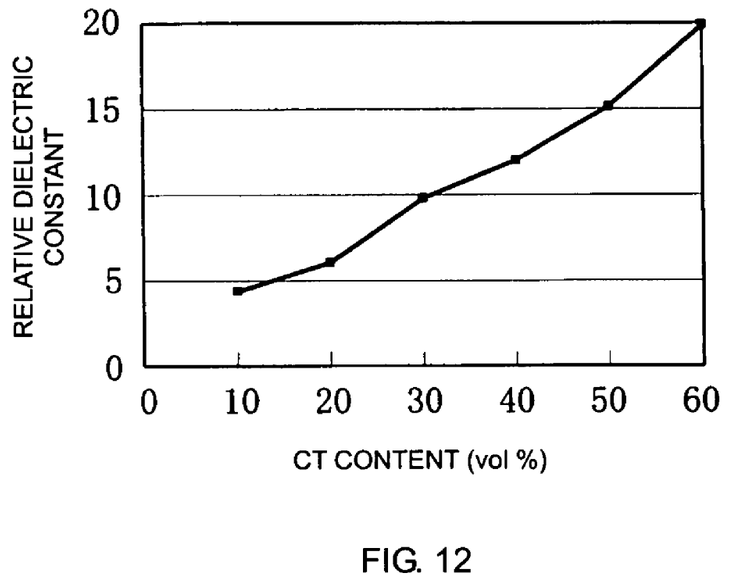
FIG. 12 is a graph showing the relation between the dielectric constant and the amount of calcium titanate dispersed in a photonic crystal portion.

FIG. 12 shows the relation between the relative dielectric constant and the amount of calcium titanate dispersed in the epoxy resin. Each of the photonic crystal units 10a, 10b, and 10c has air voids, and thus differences in the ratio between the dielectric constants of the first substance and the second substance can be made between the three-dimensional periodic structure units.

The voids of each of the photonic crystal units are impregnated with a resin having a predetermined relative dielectric constant, and thus differences in average dielectric constant can be made between the three-dimensional periodic structure units while maintaining the ratio between the dielectric constants of the first substance and the second substrate at a constant value.

The "average dielectric constant" is defined by a "value obtained by dividing the sum of the relative dielectric constants of the first and second substances by 2". Namely, the relative dielectric constants of the first and second substances in one of the units are differentiated from those of the adjacent units so that the adjacent three-dimensional periodic structure units have different average dielectric constants while maintaining the ratio between the dielectric constants of the first and second substances constant.

In this case, the position of a photonic band gap on the frequency scale depends upon the average dielectric constant of the entire units, and the sharpness and width of the photonic band gap depend on the ratio between the dielectric constants of the first and second substances in each unit. Therefore, a photonic band gap causing constant attenuation over a wide wavelength region can be formed by combining a plurality of three-dimensional periodic structure units having different average dielectric constants while maintaining the ratio between the dielectric constants of the first and second substances substantially constant.

As described above in the first to third embodiments, a photonic band gap exhibiting constant attenuation over a wide frequency region can be obtained by forming a plurality of three-dimensional periodic structure units. Referring to the rate of change in the ratio between dielectric constants shown in Table 1, a comparison between the characteristics (1) and (2) shown in FIG. 10(B) indicates that when the adjacent three-dimensional periodic structure units have a high rate of change in the ratio between the dielectric constants, the distance between two attenuation poles pa and pb becomes excessively large, and thus a sufficient attenuation cannot be obtained. Therefore, in order to achieve a sufficient attenuation, the rate of change in the ratio between the dielectric constants in the adjacent three-dimensional periodic structure units is preferably 2.0 or less, and more preferably 1.6 or less for achieving characteristics superior to the characteristics (1) shown in FIG. 10(B).

In order to widen the frequency band of a band gap, the lattice constant may be changed with the dielectric constant of the second substance to be impregnated being kept constant. For example, three-dimensional periodic structure units having lattice constants of 12 mm, 13 mm, and 14 mm, respectively, may be combined. This structure is disadvantageous in that in order to obtain a band gap in a desired frequency band, the three-dimensional periodic structure units are unequal in size. The structure is also disadvantageous in that a three-dimensional periodic structure having a small lattice constant is required for obtaining a photonic band gap in a higher frequency band, but a portion with a small lattice constant cannot be easily filled with a ceramic-dispersed resin, thereby causing difficulty in producing the structure.

In each of the embodiments, each of the photonic crystal units 10a, 10b, and 10c is composed of a resin with a low dielectric constant, and the voids are filled with a resin with a high dielectric constant. However, conversely, the voids of each photonic crystal unit may be filled with a resin having a lower dielectric constant than that of the photonic crystal units.

Although, in each of the embodiments, one period of the three-dimensional periodic structure is 12 mm, one period may be set to 0.1 mm to 30 mm. In this case, a three-dimensional periodic structure having a wide photonic band gap in a frequency band of 10 to 30 GHz can be obtained.

INDUSTRIAL APPLICABILITY

The present invention can be applied to a filter for cutting off transmission of light or an electromagnetic wave, a waveguide or resonator for trapping light or an electromagnetic wave, a laser, or an antenna.

The invention claimed is:

1. A method for producing a three-dimensional periodic structure comprising:
   providing a three-dimensional periodic structure of photocured resin containing voids and at least one partition dividing the three-dimensional periodic structure into first and second periodic areas having voids;
   introducing a first curable substance into voids in the first area of the structure and a second curable substance into voids in the second area; and
   curing the first and second substances,
   wherein (a) the first and second substances have different dielectric constants, (b) the first and second periodic area have different periods or (c) both.

2. The method for producing a three-dimensional periodic structure of claim 1, wherein each period is 0.1 to 30 mm.

3. The method for producing a three-dimensional periodic structure of claim 1, wherein the three-dimensional periodic structure provided has at least second partition separating said second area from a third periodic area having voids; and
   introducing a third substance into voids in the third area of the structure,
   in which the adjacent periodic areas have (a) substances of different dielectric constants, (b) different periods or (c) both.

4. The method for producing a three-dimensional periodic structure of claim 3, wherein the ratio of average periodic area dielectric constants between adjacent areas is 2.0 or less.

5. The method for producing a three-dimensional periodic structure of claim 4, wherein the ratio of dielectric constants between adjacent areas is 1.6 or less.

6. The method for producing a three-dimensional periodic structure of claim 3, wherein substances employed are such that the ratio of the average periodic area dielectric constant between adjacent areas increases from a first end of the structure to an opposite second end of the structure.

7. The method for producing a three-dimensional periodic structure of claim 1, wherein in each area, the dielectric constants of the photocured resin and substance in the voids are different.

8. The method for producing a three-dimensional periodic structure of claim 1, further comprising forming the structure by sequentially irradiating a first photocurable resin to form said first areas, providing the first partition, providing a second photocurable resin on the first partition, and irradiating said second photocurable resin.

9. The method for producing a three-dimensional periodic structure of claim 8, further comprising providing a second partition, providing a third photocurable resin on the second partition, and irradiating said third photocurable resin.

10. The method for producing a three-dimensional periodic structure of claim 1, wherein introducing substance into the voids comprises vacuum degassing.

11. The method for producing a three-dimensional periodic structure of claim 1, wherein each substance comprises a combination of a resin and ceramic particles.

12. The method for producing a three-dimensional periodic structure of claim 11, wherein the first and second substances have different concentrations of ceramic particles.

13. A method for producing a three-dimensional periodic structure comprising:
   providing a three-dimensional periodic structure of photocured resin containing voids and a plurality of partitions dividing the three-dimensional periodic structure into a plurality of periodic areas having voids, the voids in each area containing a curable substance; and
   curing the substance in the voids;
   wherein adjacent periodic areas have (a) substances of different dielectric constants in the voids, (b) different periods or (c) both.

14. The method for producing a three-dimensional periodic structure of claim 13, wherein each period is 0.1 to 30 mm.

15. The method for producing a three-dimensional periodic structure of claim 14, wherein the photocurable resin and substances are such that adjacent period areas have different average periodic area dielectric constants and the ratio of dielectric constants between adjacent areas is 2.0 or less.

16. The method for producing a three-dimensional periodic structure of claim 15, wherein in each area, the photocurable resin and substances are such that the dielectric constants of the photocured resin and substance in the voids are different.

17. The method for producing a three-dimensional periodic structure of claim 16, wherein each of said substances comprises a combination of a resin and ceramic particles.

18. The method for producing a three-dimensional periodic structure of claim 17, wherein each of said substances comprises a combination of a polyester resin and ceramic titanate particles and in at least two of said substances, the concentrations of ceramic particles is different.

19. The method for producing a three-dimensional periodic structure of claim 18, further comprising forming the structure by sequentially irradiating a photocurable resin to form a first periodic area; providing a partition; providing a photocurable resin on the partition; irradiating the resin; and repeating the sequence of providing a partition, providing a photocurable resin and irradiating the resin at least once.

20. The method for producing a three-dimensional periodic structure of claim 13, wherein the periodic areas have different periods and the average periodic area dielectric constant of the plurality of areas is the same.

* * * * *